(12) United States Patent
Lin et al.

(10) Patent No.: US 12,269,975 B2
(45) Date of Patent: Apr. 8, 2025

(54) COMPOSITE FILM, ENCAPSULATING STRUCTURE OF THE SAME, AND ENCAPSULATION METHOD

(71) Applicant: Industrial Technology Research Institute, Hsinchu (TW)

(72) Inventors: Cheng-Hsuan Lin, Hsinchu (TW); Yu-Ling Hsu, Hsinchu (TW); Chun-Chen Chiang, Hsinchu (TW); Yi-Ping Chen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 105 days.

(21) Appl. No.: 18/307,821

(22) Filed: Apr. 27, 2023

(65) Prior Publication Data
US 2024/0174894 A1 May 30, 2024

(30) Foreign Application Priority Data
Nov. 30, 2022 (TW) ................... 111145810

(51) Int. Cl.
*C09J 7/20* (2018.01)
*B32B 3/30* (2006.01)
(Continued)

(52) U.S. Cl.
CPC ................. *C09J 7/203* (2018.01); *B32B 3/30* (2013.01); *B32B 27/08* (2013.01); *B32B 27/20* (2013.01);
(Continued)

(58) Field of Classification Search
CPC ...... C09J 11/04; C09J 11/08; C09J 2203/318; C09J 2301/10; C09J 2301/304; C09J 2301/502; C09J 2453/00; C09J 2453/005; C09J 2453/006; C09J 7/203; C09J 7/24; C09J 7/35; H10H 20/854; H10H 20/882;
(Continued)

(56) References Cited

U.S. PATENT DOCUMENTS

| 11,286,407 B2 | 3/2022 | McAllister et al. |
| 2012/0074450 A1 | 3/2012 | Sakurai et al. |
| 2014/0104689 A1* | 4/2014 | Padiyath ............. G02B 5/0242 359/592 |
| 2015/0132873 A1 | 5/2015 | Rogers et al. |

(Continued)

FOREIGN PATENT DOCUMENTS

| CN | 101661191 | 3/2010 |
| CN | 201621532 | 11/2010 |

(Continued)

OTHER PUBLICATIONS

"Office Action of Taiwan Counterpart Application", issued on Dec. 5, 2023, p. 1-p. 6.

*Primary Examiner* — Hai Vo
(74) *Attorney, Agent, or Firm* — JCIPRNET

(57) ABSTRACT

A composite film includes a first thermoplastic elastomer film layer and a second thermoplastic elastomer film layer, wherein the first thermoplastic elastomer film layer includes a first styrenic block copolymer. The second thermoplastic elastomer film layer is disposed on the first thermoplastic elastomer film layer, wherein the second thermoplastic elastomer film layer includes a second styrenic block copolymer, diffusion particles dispersed in the second thermoplastic elastomer film layer, and a surface microstructure disposed on the surface of the second thermoplastic elastomer film layer.

11 Claims, 1 Drawing Sheet

(51) Int. Cl.
  *B32B 27/08* (2006.01)
  *B32B 27/20* (2006.01)
  *B32B 27/30* (2006.01)
  *C09J 11/04* (2006.01)
  *C09J 11/08* (2006.01)
  *H10H 20/854* (2025.01)

(52) U.S. Cl.
  CPC ............. *B32B 27/302* (2013.01); *C09J 11/04* (2013.01); *C09J 11/08* (2013.01); *H10H 20/854* (2025.01); *C09J 2301/10* (2020.08); *C09J 2301/304* (2020.08); *C09J 2301/502* (2020.08); *C09J 2453/005* (2013.01)

(58) Field of Classification Search
  CPC ........... B32B 3/30; B32B 27/08; B32B 27/20; B32B 27/02
  See application file for complete search history.

(56) References Cited

U.S. PATENT DOCUMENTS

| | | |
|---|---|---|
| 2017/0222183 A1 | 8/2017 | Cho et al. |
| 2018/0230342 A1 | 8/2018 | Pütz et al. |
| 2021/0187819 A1* | 6/2021 | Connell ................ B08B 17/065 |

FOREIGN PATENT DOCUMENTS

| | | |
|---|---|---|
| CN | 112652642 | 4/2021 |
| CN | 212874536 | 4/2021 |
| CN | 112852201 | 5/2021 |
| CN | 112885818 | 6/2021 |
| CN | 113740036 | 12/2021 |
| CN | 113831850 | 12/2021 |
| TW | I682428 | 1/2020 |
| TW | I732434 | 7/2021 |
| TW | 202144523 | 12/2021 |

* cited by examiner

COMPOSITE FILM, ENCAPSULATING STRUCTURE OF THE SAME, AND ENCAPSULATION METHOD

CROSS-REFERENCE TO RELATED APPLICATION

This application claims the priority benefit of Taiwan application serial no. 111145810, filed on Nov. 30, 2022. The entirety of the above-mentioned patent application is hereby incorporated by reference herein and made a part of this specification.

TECHNICAL FIELD

The disclosure relates to a composite film, an encapsulating structure thereof, and an encapsulation method.

BACKGROUND

Small and medium-sized backlight modules are gradually being changed to mini-LED direct-lit type backlight modules. The mini-LED array distributed in the light-emitting diode unit not only has a small pitch and a large number of light-emitting diode chips, but also may reduce the light mixing distance to achieve a thinner backlight profile in display panel, and may realize more local dimming area to provide a higher dynamic range. In the prior art, encapsulating adhesive is used to fully coat the light-emitting diode unit to protect thousands of light-emitting diodes on the surface of the light-emitting diode unit. At present, the most commonly used encapsulation adhesive materials are silicone rubber, epoxy resin, and optical clear adhesive (OCA), etc.

When several light emitting diodes in a certain region failed and needs repairment, or bubbles are generated during encapsulation process, the conventional method is to replace the entire light-emitting diode unit and the mini-LED backlight module light panel, which is not only not environmentally friendly but also expensive. However, since the encapsulation adhesive is a thermosetting material, other light-emitting diodes in unspecific positions may also be pulled off by the encapsulation adhesive when fixing the damaged light-emitting diode/diodes, regardless of whether the diodes failed or not, which increases the cost of maintenance.

To sum up, there is an urgent need to develop new encapsulating materials that are easy to detach from a surface. For example, thermoplastic encapsulating materials that may be plastically deformed at high temperatures, may be easily debonded by heating and detached from the light panel without pulling off the light-emitting diodes on the light-emitting diode unit.

SUMMARY

The disclosure provides a composite film, which may be peeled off without having residual adhesive from a surface of a substrate, to which the composite film is bonded, at a temperature below 80° C.

A composite film of the disclosure includes a first thermoplastic elastomer film layer, in which the first thermoplastic elastomer film layer includes a first styrenic block copolymer. The composite film includes a second thermoplastic elastomer film layer disposed on the first thermoplastic elastomer film layer, in which the second thermoplastic elastomer film layer includes a second styrenic block copolymer, diffusion particles dispersed in the second thermoplastic elastomer film layer, and a surface microstructure disposed on a surface of the second thermoplastic elastomer film layer.

A light-emitting diode (LED) backlight module provided by an embodiment of the disclosure includes an LED unit having at least one surface and the composite film. The composite film is disposed on and encapsulates the at least one surface of the LED unit.

An encapsulation method of a light-emitting device provided by an embodiment of the disclosure includes encapsulating the composite film on a surface of a substrate of a light-emitting diode (LED) unit by heat pressing, and the first thermoplastic elastomer film layer in the composite film is in direct contact with the surface of the substrate.

DETAILED DESCRIPTION OF DISCLOSED EMBODIMENTS

Figure 1:
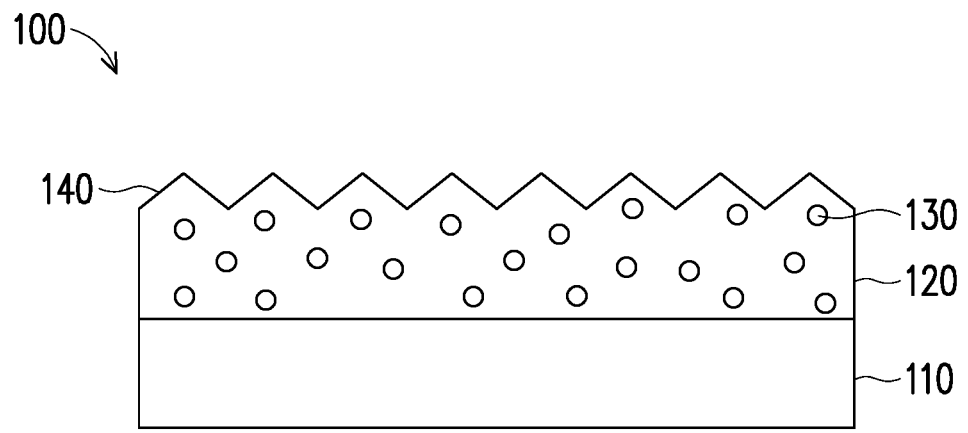
FIG. 1 is a partial cross-sectional schematic view of a composite film according to an embodiment of the disclosure.

FIG. 1 is a partial cross-sectional schematic view of a composite film according to an embodiment of the disclosure. Referring to the embodiment of FIG. 1, a composite film 100 of the disclosure includes a first thermoplastic elastomer film layer 110, in which the first thermoplastic elastomer film layer 110 includes a first styrenic block copolymer. The composite film 100 includes a second thermoplastic elastomer film layer 120 disposed on the first thermoplastic elastomer film layer 110, in which the second thermoplastic elastomer film layer 120 includes a second styrenic block copolymer, diffusion particles 130 dispersed in the second thermoplastic elastomer film layer 120, and a surface microstructure 140 disposed on a surface of the second thermoplastic elastomer film layer 120.

In some embodiments, the first styrenic block copolymer in the first thermoplastic elastomer film layer 110 and the second styrenic block copolymer in the second thermoplastic elastomer film layer 120 of the composite film 100 respectively, include a first block derived from styrene and a second block derived from styrene-ethylene-butylene-styrene copolymer, in which the weight ratio of styrene to styrene-ethylene-butylene-styrene copolymer is 0.2/1 to 0.35/1. When the weight ratio of styrene to styrene-ethylene-butylene-styrene copolymer is too small, the bonding between the composite film and the LED unit is low; when the weight ratio of styrene to styrene-ethylene-butylene-styrene copolymer is too large, the composite film bonded to the LED module cannot pass the 85° C./85% RH environmental test.

In some embodiments, the first thermoplastic elastomer film layer 110 of the composite film 100 further includes an adhesive.

In some embodiments, a content of the adhesive is 5 to 20 parts by weight based on 100 parts by weight of the first styrenic block copolymer in the first thermoplastic elastomer film layer 110 of the composite film 100. When the weight ratio of the adhesive to the first styrenic block copolymer is too small, the bonding between the composite film and the LED unit is low; when the weight ratio of the adhesive to the first styrenic block copolymer is too large, the composite film bonded to the LED unit cannot pass the 85° C./85% RH environmental test, results in the occurrence of air bubbles between the composite film and the LED unit.

In some embodiments, the adhesive includes C5 aliphatic resin, dicyclopentadiene or C9 aromatic resin.

In some embodiments, the first styrenic block copolymer is the same as the second styrenic block copolymer.

In some embodiments, the first styrenic block copolymer is different from the second styrenic block copolymer.

In some embodiments, the diffusion particles 130 of the second thermoplastic elastomer film layer 120 of the composite film 100 include silicon dioxide, polymethyl methacrylate, polystyrene, titanium dioxide, or a combination thereof. In addition, the content of the diffusion particles is 1 to 5 parts by weight based on 100 parts by weight of the second thermoplastic elastomer film layer 120. When the content of the diffusion particles 130 is too small, the bonding between the composite film and the LED unit is high, but the luminance uniformity of the LED backlight module decreases; when the content of the diffusion particles 130 is too large, the bonding between the composite film and the LED unit is low, and when the composite film is bonded to the LED unit, it cannot pass the 85° C./85% RH environmental test, results in the occurrence of air bubbles between the composite film and the LED unit.

In some embodiments, the particle diameter of the diffusion particles 130 of the second thermoplastic elastomer film layer 120 of the composite film 100 ranges from 2 microns to 10 microns. When the particle diameter of the diffusion particles 130 is too small, the haze is large and the transmittance is low, which reduces the light output intensity; when the particle diameter of the diffusion particles 130 is too large, the transmittance is high and the haze is small, which reduces the luminance uniformity of the LED backlight module.

In some embodiments, the surface microstructure of the second thermoplastic elastomer film layer 120 of the composite film 100 includes pyramidal structure, sinusoidal wave structure or hemispherical structure, and the aspect ratio of the surface microstructure 140 is 0.04 to 0.2. When the aspect ratio of the surface microstructure 140 is too small, the degree of light diffusion is weak, and the luminance uniformity of the overall light emission is not good; when the aspect ratio of the surface microstructure 140 is too large, the light is focused, thus reducing the luminance uniformity of the LED backlight module.

In some embodiments, the composite film 100 is peeled off from a surface of a substrate to which the composite film is bonded, at a temperature below 80° C. without having residual adhesive.

Figure 2:
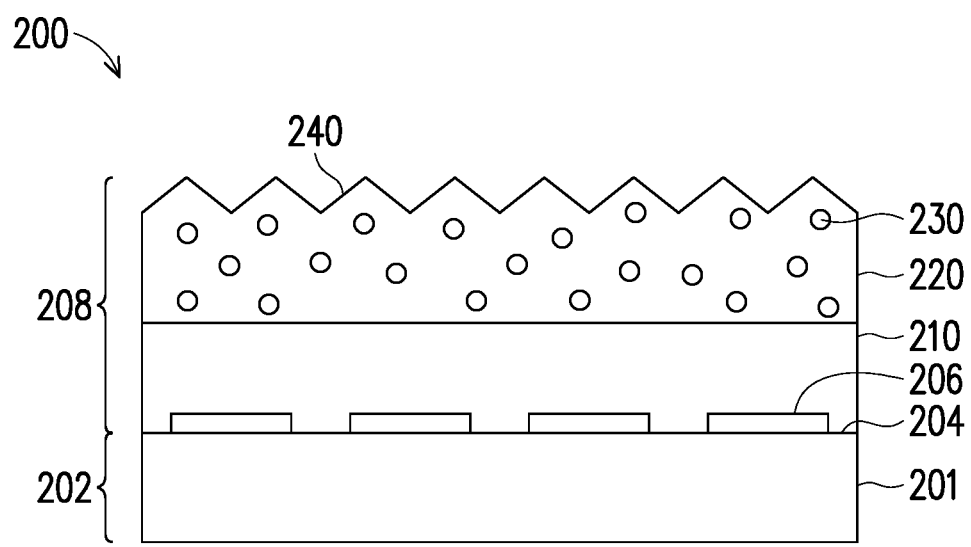
FIG. 2 is a partial cross-sectional schematic view of an LED backlight module according to another embodiment of the disclosure.

FIG. 2 is a cross-sectional schematic view of an LED backlight module 200 according to another embodiment of the disclosure. Referring to the embodiment in FIG. 2, a light-emitting diode (LED) backlight module 200 provided by an embodiment of the disclosure includes an LED unit 202 having at least one surface 204. The LED backlight module 200 also includes a composite film 208, disposed and encapsulated on the surface 204 of the LED unit 202.

In some embodiments, the LED unit 202 of the LED backlight module 200 includes a substrate 201, a plurality of light emitting diodes (LEDs) 206 disposed on the substrate 201, and a composite film 208 disposed on and encapsulating the plurality of LEDs 206.

In some embodiments, the composite film 208 of the disclosure includes a first thermoplastic elastomer film layer 210, in which the first thermoplastic elastomer film layer 210 includes a first styrenic block copolymer. The composite film 208 also includes a second thermoplastic elastomer film layer 220 disposed on the first thermoplastic elastomer film layer 210, in which the second thermoplastic elastomer film layer 220 includes a second styrenic block copolymer, diffusion particles 230 dispersed in the second thermoplastic elastomer film layer 220, and a surface microstructure 240 disposed on a surface of the second thermoplastic elastomer film layer 120.

In some embodiments, the bonding between the composite film 208 in the LED backlight module 200 and the surface 204 of the LED unit 202 is between 1200 gf/25 mm and 2000 gf/25 mm.

An encapsulation method for the LED backlight module 200 provided in an embodiment of the disclosure includes encapsulating the composite film 208 on the surface 204 of the substrate 201 of the LED unit 202 by heat pressing, and the first thermoplastic elastomer film layer 210 in the composite film 208 is in direct contact with the surface 204 of the substrate 201.

In some embodiments, the encapsulation method for the LED backlight module 200 is performed by heat pressing, and the heat pressing temperature is between 150° C. and 180° C.

Therefore, the composite film provided by the disclosure may be plastically deformed at a temperature between 150° C. and 180° C., and the composite film may be easily detached the LED unit without pulling off the LEDs on the LED unit. The following experiments are listed to verify the effect of the disclosure, but the disclosure is not limited to the following content.

Experimental Example

The following experimental examples use materials including a first styrenic block copolymer and a second styrenic block copolymer with a weight ratio of the styrene and the styrene-ethylene-butylene-styrene copolymer of 20% (SEBS, Kraton MD 1648), 34% (SEBS, Kraton MD6951), 18% (SEBS, Taipol 6014), and 40% (SEBS, Tuftec H1053), respectively; an adhesive (Cleartack, W140); diffusion particles (Soken, SRP-200).

In the following experimental examples, the haze testing is carried out using a haze meter (supplied by Nippon Denshoku, NDH-2000), and the testing items are transmittance (TT %) and haze value (Hz %). The aging test instrument uses a temperature and humidity chamber (supplied by KSON, THS-A4T), which measurement standard follows IEC 60068-2-87 (85° C./85% RH/300 hours). The luminance uniformity (U %) of the backlight is measured with a luminance meter (supplied by Titan Electro-Optics, PR-655). During measurement at room temperature, the bright area is defined as the position just above the light emitting diode (LED) and the dark area is defined as the position in the center of the four adjoining LEDs, so the luminance uniformity (% U) is defined as % $U = I_{center\ of\ the\ four\ adjoining\ LEDs} / I_{just\ above\ the\ LED} *100\%$, in which U stands for uniformity and I stands for illumination, respectively. The bonding test is performed using a tensile machine (supplied by Cometech, QC-513A2-204), which measures the bonding of an adhesive and the LED unit, when peeled at 180° angle at room temperature, with a stripe width of 25 mm, the measurement standard follows ASTM D3330.

Experimental Example 1

A first styrenic block copolymer with a weight ratio of styrene to styrene-ethylene-butylene-styrene copolymer of 20% (SEBS, Kraton MD 1648), at a temperature of 140 to 170° C. and a screw rotation speed of 250 to 300 rpm, and a second styrenic block copolymer (with a weight ratio of styrene to styrene-ethylene-butylene-styrene copolymer of 20% (SEBS, Kraton MD 1648)) at a temperature between 140 and 170° C. and a screw rotation speed of 250 to 300 rpm, were respectively loaded into a twin-screw extruder, and after being melted and conveyed at high temperature, the molten polymers were co-extruded from a co-extrusion die, which channel had been designed to form a double-layer film.

Then, the double-layered film was cooled, rolled, and wound up to form an integrated composite film. The composition of the composite film included a second thermoplastic elastomer film layer positioned at the upper layer, and its composition included a second styrenic block copolymer (with a weight ratio of styrene to styrene-ethylene-butylene-styrene copolymer of 20%); and the first styrenic block copolymer located at the lower layer (with a weight ratio of styrene to styrene-ethylene-butylene-styrene copolymer of 20%).

The composite film formed by the double-layer co-extrusion die had a transmittance (TT %) of 87.66% and a haze value (Hz %) of 89.02%, and the thickness of the first thermoplastic elastomer film layer of the composite film was 250 μm and the thickness of the second thermoplastic elastomer film layer was 100 μm.

Next, the obtained composite film was used in light-emitting diode unit encapsulation; the steps included covering the composite film on the surface of the substrate of the LED unit, and then placing the LED unit into a heat pressing machine. The heat pressing machine had an upper template and a lower template, the upper template had a surface microstructure, and the lower template had a flat structure. During the heat-pressed bonding process, the first thermoplastic elastomer film layer of the composite film faced the substrate of the LED unit, while the second thermoplastic elastomer film layer faced the template with the surface microstructure. At a heat pressing temperature ranging from 150° C. to 180° C., the first thermoplastic elastomer film of the composite film was heat-pressed and bonded to the substrate of the LED unit, while the second thermoplastic elastomer film of the composite film formed a surface microstructure corresponding to the upper template of the heat pressing machine. After cooling, an LED backlight module was obtained. The LED backlight module had a LED unit (including a substrate and a plurality of LEDs, and a composite film which was disposed on and encapsulating the plurality of LEDs. The surface microstructure of the second thermoplastic elastomer film layer was a sinusoidal wave structure, and the aspect ratio of the surface microstructure was 0.16. The luminance uniformity (U %) of the LED backlight module was 58.46%, the bonding between the composite film and the substrate of the LED unit was 970 gf/25 mm, and the LED backlight module also passed the 85° C./85% RH/300 hours aging test.

Experimental Example 2

The composite film was formed using the same materials and preparation methods as those described in Experimental Example 1, excepted that the raw material used in the first styrenic block copolymer and the second styrenic block copolymer was styrene/SEBS copolymer with a weight ratio of 34% (Kraton MD 6951). The composite film formed by the double-layer co-extrusion die had a transmittance (TT %) of 88.37%, a haze value (Hz %) of 90.16%, the thickness of the first thermoplastic elastomer film layer of the composite film was 250 μm, and the thickness of the second thermoplastic elastomer film layer was 100 km. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 69.3%, the bonding between the composite film and the substrate of the LED unit was 1130 gf/25 mm, and the LED backlight module also passed 85° C./85% RH/300 hours aging test.

Comparative Example 1

The composite film was formed using the same materials and preparation methods as those described in Experimental Example 1, excepted that the raw material used in the first styrenic block copolymer and the second styrenic block copolymer was styrene/SEBS copolymer with a weight ratio of 18% (Taipol 6014). The composite film formed by the double-layer co-extrusion die had a transmittance (TT %) of 88.32%, a haze value (Hz %) of 89.76%, the thickness of the first thermoplastic elastomer film layer of the composite film was 250 μm, and the thickness of the second thermoplastic elastomer film layer was 100 km. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 56.67%. The bonding between the composite film and the substrate of the LED unit was slightly lower (of 760 gf/25 mm), and the LED backlight module also passed the 85° C./85% RH/300 hours aging test.

Comparative Example 2

The composite film was formed using the same materials and preparation methods as those described in Experimental Example 1, excepted that the raw material used in the first styrenic block copolymer and the second styrenic block copolymer was styrene/SEBS copolymer with a weight ratio of 40% (Tuftec H1053). The transmittance (TT %) of the composite film formed by the double-layer co-extrusion die was 89.1%, and the haze value (Hz %) was 89.98%. The thickness of the first thermoplastic elastomer film layer of the composite film was 250 μm, and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 69.9%. The bonding between the composite film and the substrate of the LED unit was at 1208 gf/25 mm, but the 85° C./85% RH/300 hours aging test failed.

According to the results of the Experimental Examples 1 to 2 and Comparative Examples 1 to 2, under the circumstances of using only the first styrenic block copolymer and the second styrenic block copolymer with different styrene/SEBS weight ratios as raw materials (with no adhesives and diffusion particles added), the composite film having a weight ratio of styrene to styrene-ethylene-butylene-styrene copolymer in the first styrenic block copolymer and the second styrenic block copolymer ranging from 0.2/1 to 0.34/1, and formed by a double-layer co-extrusion die and further encapsulated in the LED unit, had a better composite film performance. Within the weight ratio range, when one or more of the light-emitting diodes of the LED unit failed and needed repairment, the composite film can be pulled off and removed from the substrate of the light-emitting diode unit using a heat gun at a temperature of about 80° C., without pulling off the light-emitting diode, and leaving no adhesive residual.

When the weight ratio of styrene to styrene-ethylene-butylene-styrene copolymer was less than 0.2/1, the bonding between the composite film and the light-emitting diode unit was low; alternatively, when the weight ratio of styrene to styrene-ethylene-butylene-styrene copolymer thermoplastic elastomer was greater than 0.35/1, the LED module could not pass the 85° C./85% RH environmental test.

Experimental Example 3

A first styrenic block copolymer with a weight ratio of styrene to styrene-ethylene-butylene-styrene copolymer of 34% (SEBS, Kraton MD 1648) was mixed with a weight ratio of 10% adhesive (W140) using a mixer granulator to form a first mixture. The first mixture, at a temperature of 140 to 170° C. and a screw rotation speed of 250 to 300 rpm, and a second styrenic block copolymer (with a weight ratio of styrene to styrene-ethylene-butylene-styrene copolymer of 34% (SEBS, Kraton MD 1648)) at a temperature between 140 and 170° C. and a screw rotation speed of 250 to 300 rpm, were respectively loaded into a twin-screw extruder, and after being melted and conveyed at high temperature, the molten polymers were co-extruded from a co-extrusion die, which channel had been designed to form a double-layer film.

Then, the double-layered film was cooled, rolled, and wound up to form an integrated composite film. The composition of the composite film included a second thermoplastic elastomer film layer positioned at the upper layer, and its composition included a second styrenic block copolymer (with a weight ratio of styrene to styrene-ethylene-butylene-styrene copolymer of 34%), and a first thermoplastic elastomer film positioned at the lower layer, the composition of the first thermoplastic elastomer film included the first styrenic block copolymer (with a weight ratio of styrene to styrene-ethylene-butylene-styrene copolymer of 34%) and the 10% adhesive.

The transmittance (TT %) of the composite film formed by the double-layer co-extrusion die was 88.32%, and the haze value (Hz %) was 90.31%. The thickness of the first thermoplastic elastomer film layer of the composite film was 250 μm and the thickness of the second thermoplastic elastomer film layer was 100 μm.

The LED backlight module was formed by heat pressing in the same manner as those described in Experimental Example 1, in which the surface microstructure of the second thermoplastic elastomer film layer was a sinusoidal wave structure, and the aspect ratio of the surface microstructure was 0.16. The luminance uniformity (U %) of the LED backlight module was 70.1%. The bonding between the composite film and the substrate of the LED unit was at 2049 gf/25 mm, and the LED backlight module also passed the 85° C./85% RH/300 hours aging test.

Experimental example 4 The composite film was formed using the same materials and preparation methods as those described in Experimental Example 3, except that an adhesive with a weight ratio of 15% (W140) was added to the first styrenic block copolymer. The transmittance (TT %) of the composite film formed by the double-layer co-extrusion die was 87.86%, and the haze value (Hz %) was 89.82%. The thickness of the first thermoplastic elastomer film layer of the composite film was 250 μm, and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 70.3%. The bonding between the composite film and the substrate of the LED unit was at 2231 gf/25 mm, and the LED backlight module also passed the 85° C./85% RH/300 hours aging test.

Experimental Example 5

The composite film was formed using the same materials and preparation methods as those described in Experimental Example 3, except that an adhesive with a weight ratio of 20% (W140) was added to the first styrenic block copolymer. The transmittance (TT %) of the composite film formed by the double-layer co-extrusion die was 88.21%, and the haze value (Hz %) was 90.67%. The thickness of the first thermoplastic elastomer film layer of the composite film was 250 μm, and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 69.6%. The bonding between the composite film and the substrate of the LED unit was at 2357 gf/25 mm, and the LED backlight module also passed the 85° C./85% RH/300 hours aging test.

Comparative Example 3

The composite film was formed using the same materials and preparation methods as those described in Experimental Example 3, except that an adhesive with a weight ratio of 25% (W140) was added to the first styrenic block copolymer. The transmittance (TT %) of the composite film formed by the double-layer co-extrusion die was 88.19%, and the haze value (Hz %) was 89.56%. The thickness of the first thermoplastic elastomer film layer of the composite film was 250 μm, and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 70.5%. The bonding between the composite film and the substrate of the LED unit was at 2526 gf/25 mm, but the 85° C./85% RH/300 hours aging test failed.

According to the results of the Experimental Examples 3 to 5 and Comparative Example 3, under the circumstances of fixing the weight ratio of styrene to styrene-ethylene-butylene-styrene copolymer thermoplastic elastomer of the first thermoplastic elastomer film layer and the second thermoplastic elastomer film layer at 0.34/1 as raw materials (with no diffusion particles added in the second thermoplastic elastomer film layer, but with different content of the adhesive added in the first thermoplastic elastomer film layer), the composite film having a content of the adhesive ranging from 5 to 20 parts by weight; based on 100 parts by weight of the first styrenic block copolymer in first thermoplastic elastomer film layer, and formed by a double-layer co-extrusion die and further encapsulated in the LED unit, had a better composite film performance. Within the weight ratio range, when one or more of the light-emitting diodes of the LED unit failed and needed repairment, the composite film could be pulled off and removed from the substrate of the light-emitting diode unit using a heat gun at a temperature of about 80° C., without pulling off the light-emitting diode, and leaving no adhesive residual.

When the content of the added adhesive was less than 5 parts by weight based on 100 parts by weight of the first styrenic block copolymer, the bonding between the composite film and the LED unit was low; when the content of the added adhesive was greater than 20 parts by weight based on 100 parts by weight of the first styrenic block copolymer, the composite film bonded to the LED unit cannot pass the 85° C./85% RH environmental test, resulted in the occurrence of air bubbles between the composite film and the LED unit.

Experimental Example 6

A first styrenic block copolymer with a weight ratio of styrene to styrene-ethylene-butylene-styrene copolymer of 34% (SEBS, Kraton MD 6951)) was mixed with a weight ratio of 10% adhesive (W140) using a mixer granulator to form a second mixture. Next, a second styrenic block copolymer (with a weight ratio of styrene to styrene-ethylene-butylene-styrene copolymer of 34% (SEBS, Kraton MD 6951)) was mixed with a weight ratio of 1% diffusion particles (SRP-200) using the mixer granulator to form a third mixture. The second mixture, at a temperature of 140 to 170° C. and a screw rotation speed of 250 to 300 rpm, and the third mixture, at a temperature of 140 to 170° C. and a screw rotation speed of 250 to 300 rpm, were respectively loaded into a twin-screw extruder, and after being melted and conveyed at high temperature, the molten polymers were co-extruded from a co-extrusion die, which channel had been designed to form a double-layer film.

Then, the double-layered film was cooled, rolled, and wound up to form an integrated composite film. The composition of the composite film included a second thermoplastic elastomer film layer positioned at the upper layer, its composition included a second styrenic block copolymer (with a weight ratio of styrene to styrene-ethylene-butylene-styrene copolymer of 34%), and the 1% diffused particles dispersed in the second thermoplastic elastomer film layer, in which the particle diameter of the diffused particles was 2 microns, and a first thermoplastic elastomer film positioned at the lower layer, the composition of the first thermoplastic elastomer film included the first styrenic block copolymer (with a weight ratio of styrene to styrene-ethylene-butylene-styrene copolymer of 34%) and the 10% adhesive.

The transmittance (TT %) of the composite film formed by the double-layer co-extrusion die was 88.37%, and the haze value (Hz %) was 90.3%. The thickness of the first thermoplastic elastomer film layer of the composite film was 250 μm and the thickness of the second thermoplastic elastomer film layer was 100 μm.

The LED backlight module was formed by heat pressing in the same manner as those described in Experimental Example 1, in which the surface microstructure of the second thermoplastic elastomer film layer was a sinusoidal wave structure, and the aspect ratio of the surface microstructure was 0.16. The luminance uniformity (U %) of the LED backlight module was 76.24%. The bonding between the composite film and the substrate of the LED unit was at 1915 gf/25 mm, and the LED backlight module also passed the 85° C./85% RH/300 hours aging test.

Experimental Example 7

The composite film was formed using the same materials and preparation methods as those described in Experimental Example 6, except that diffusion particles with a weight ratio of 3% (SRP-200) were added to the second styrenic block copolymer, wherein the particle diameter of the diffusion particles was 2 microns. The transmittance (TT %) of the composite film formed by the double-layer co-extrusion die was 83.42%, and the haze value (Hz %) was 98.5%. The thickness of the first thermoplastic elastomer film layer of the composite film was 250 μm, and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 88.7%. The bonding between the composite film and the substrate of the LED unit was at 1783 gf/25 mm, and the LED backlight module also passed the 85° C./85% RH/300 hours aging test.

Experimental Example 8

The composite film was formed using the same materials and preparation methods as those described in Experimental Example 6, except that diffusion particles with a weight ratio of 5% (SRP-200) were added to the second styrenic block copolymer, wherein the particle diameter of the diffusion particles was 2 microns. The transmittance (TT %) of the composite film formed by the double-layer co-extrusion die was 60.01%, and the haze value (Hz %) was 99.5%. The thickness of the first thermoplastic elastomer film layer of the composite film was 250 μm and the thickness of the second thermoplastic elastomer film layer was 100 μm. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 85.1%. The bonding between the composite film and the substrate of the LED unit was at 1353 gf/25 mm, and the LED backlight module also passed the 85° C./85% RH/300 hours aging test.

Comparative Example 4

The composite film was formed using the same materials and preparation methods as those described in Experimental Example 6, except that diffusion particles with a weight ratio of 7% (SRP-200) were added to the second styrenic block copolymer, wherein the particle diameter of the diffusion particles was 2 microns. The transmittance (TT %) of the composite film formed by the double-layer co-extrusion die was 43.2%, and the haze value (Hz %) was 99.7%. The thickness of the first thermoplastic elastomer film layer of the composite film was 250 μm, and the thickness of the second thermoplastic elastomer film layer was 100 km. A LED backlight module formed after being heat-pressed and bonded with the composite film had a sinusoidal wave structure on the surface of the second thermoplastic elastomer film layer, and the aspect ratio of the surface microstructure was 0.16. The luminance uniformity (U %) of the LED backlight module was 83.6%. The bonding between the composite film and the substrate of the LED unit was at 1129 gf/25 mm, and the 85° C./85% RH/300 hours aging test failed.

According to the results of the Experimental Examples 6 to 8 and Comparative Example 4, under the circumstances of fixing the weight ratio of styrene to styrene-ethylene-butylene-styrene copolymer thermoplastic elastomer of the first thermoplastic elastomer film layer and the second thermoplastic elastomer film layer at 0.34/1, fixing the weight ratio of the adhesive in the first thermoplastic elastomer film layer to the first styrenic block copolymer at 0.1/1 (with different weight ratio of diffusion particles added in the second thermoplastic elastomer film layer), the composite film having a content of the diffusion particles ranging from 1 to 5 parts by weight based on 100 parts by weight of the second thermoplastic elastomer film layer, and formed by a double-layer co-extrusion die and further encapsulated in the LED unit, had a better composite film performance. Within this range, when one or more of the light-emitting diodes of the LED unit failed and needed repairment, the composite film can be pulled off and removed from the substrate of the light-emitting diode unit using a heat gun at a temperature of about 80° C., without pulling off the light-emitting diode, and leaving no adhesive residual.

When the content of the diffusion particles was less than 1, the bonding between the composite film and the LED unit was low, and the luminance uniformity of the LED module decreases. When the content of the diffusion particles was greater than 5, the LED unit could not pass the 85° C./85% RH environmental test.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and their equivalents and not by the above detailed descriptions.

What is claimed is:

1. A light-emitting diode (LED) backlight module, comprising:
   a light-emitting diode (LED) unit, having at least one surface; and
   a composite film, disposed on and encapsulating the at least one surface of the LED unit, wherein the LED unit comprises a substrate, and a plurality of LEDs disposed on the substrate;
   the composite film comprises:
   a first thermoplastic elastomer film layer, comprising a first styrenic block copolymer; and
   a second thermoplastic elastomer film layer, disposed on the first thermoplastic elastomer film layer, wherein the second thermoplastic elastomer film layer comprises a second styrenic block copolymer, a plurality of diffusion particles dispersed in the second thermoplastic elastomer film layer, wherein the diffusion particles comprise silicon dioxide, polymethyl methacrylate, polystyrene, titanium dioxide, or a combination thereof;
   a surface microstructure disposed on a surface of the second thermoplastic elastomer film layer opposite the first thermoplastic elastomer film layer, wherein the surface microstructure comprises pyramidal structure, sinusoidal wave structure or hemispherical structure, with an aspect ratio of 0.04 to 0.2; and
   wherein the first thermoplastic elastomer film layer is in direct contact with the substrate of the LED unit.

2. The LED backlight module according to claim 1, wherein the bonding between the composite film and the at least one surface of the LED unit is between 1200 gf/25 mm and 2000 gf/25 mm.

3. The LED backlight module according to claim 1, wherein the first styrenic block copolymer and the second styrenic block copolymer each comprises a first block derived from styrene and a second block derived from styrene-ethylene-butylene-styrene copolymer, wherein a weight ratio of the styrene to the styrene-ethylene-butylene-styrene copolymer is 0.2/1 to 0.35/1.

4. The LED backlight module according to claim 1, wherein the first thermoplastic elastomer film layer further comprises an adhesive.

5. The LED backlight module according to claim 4, wherein in the first thermoplastic elastomer film layer, a content of the adhesive is 5 to 20 parts by weight based on 100 parts by weight of the first styrenic block copolymer.

6. The LED backlight module according to claim 4, wherein the adhesive comprises C5 aliphatic resin, dicyclopentadiene, or C9 aromatic resin.

7. The LED backlight module according to claim 1, wherein the first styrenic block copolymer is the same as the second styrenic block copolymer.

8. The LED backlight module according to claim 1, wherein the first styrenic block copolymer is different from the second styrenic block copolymer.

9. The LED backlight module according to claim 1, wherein a content of the diffusion particles is 1 to 5 parts by weight based on 100 parts by weight of the second thermoplastic elastomer film layer.

10. The LED backlight module according to claim 1, wherein a particle diameter of the diffusion particles of the second thermoplastic elastomer film layer ranges from 2 microns to 10 microns.

11. The LED backlight module according to claim 1, wherein the composite film is peeled off from a surface of a substrate to which the composite film is bonded, at a temperature below 80° C. without having residual adhesive.

* * * * *